United States Patent [19]
Kitaguchi

[11] Patent Number: 5,457,322
[45] Date of Patent: Oct. 10, 1995

[54] SEMICONDUCTOR RADIATION DETECTION APPARATUS FOR DISCRIMINATING RADIATION HAVING DIFFERING ENERGY LEVELS

[75] Inventor: Hiroshi Kitaguchi, Ibaraki, Shigeru IZumi, Tokyo, both of Japan

[73] Assignee: Hitachi, Ltd., Japan

[21] Appl. No.: 219,353

[22] Filed: Mar. 29, 1994

Related U.S. Application Data

[63] Continuation of Ser. No. 130,425, Oct. 1, 1993, abandoned, which is a continuation of Ser. No. 798,129, Nov. 26, 1991, abandoned.

[30] Foreign Application Priority Data

Nov. 28, 1990 [JP] Japan ................................ 2-322867

[51] Int. Cl.$^6$ .................................................... G01T 1/24
[52] U.S. Cl. ............................ 250/370.06; 250/370.02; 257/429
[58] Field of Search ................... 250/370.06, 370.01, 250/370.02, 370.13, 370.14; 257/428, 429, 430

[56] References Cited

U.S. PATENT DOCUMENTS

| | | | |
|---|---|---|---|
| 3,131,305 | 4/1964 | Shombert | 250/370.06 |
| 3,484,663 | 12/1969 | Halus | 250/370.06 |
| 3,792,197 | 2/1974 | Chai | 357/31 |
| 4,011,016 | 3/1977 | Layne et al. | 357/58 |
| 4,309,604 | 1/1982 | Yoshikawa et al. | 250/211J |
| 4,651,001 | 3/1987 | Harada et al. | 250/370.06 |

FOREIGN PATENT DOCUMENTS

| | | | |
|---|---|---|---|
| 56-97764 | 12/1954 | Japan . | |
| 54-27384 | 3/1979 | Japan . | |
| 57-149982 | 9/1982 | Japan . | |
| 61-152082 | 7/1986 | Japan . | |
| 156368 | 6/1988 | Japan | 357/29 |
| 53274 | 2/1992 | Japan | 257/429 |

OTHER PUBLICATIONS

Avdeichikov, "Semiconductor Si (npn) Detector With Two Surface–Barrier Junction", Nuclear Instruments and Methods, 138, No. 2, Oct., 1976, p. 381.

Primary Examiner—Carolyn E. Fields
Attorney, Agent, or Firm—Evenson, McKeown, Edwards & Lenahan

[57] ABSTRACT

The invention provides a high sensitivity semiconductor radiation detection apparatus having pn junctions formed in opposite surfaces of at least one semiconductor wafer. A common electrode for the pn junctions is formed in the substrate region of the semiconductor wafers, and a variable reverse bias voltage is supplied to an electrode formed in contact with at least one of the pn junctions, to vary the thickness of the depletion region generated at said pn junction, and hence the sensitivity of said junction to incident radiation of varying energy levels. By adjusting the relative thickness of the respective depletion regions, different types of radiation may be distinguished.

22 Claims, 11 Drawing Sheets

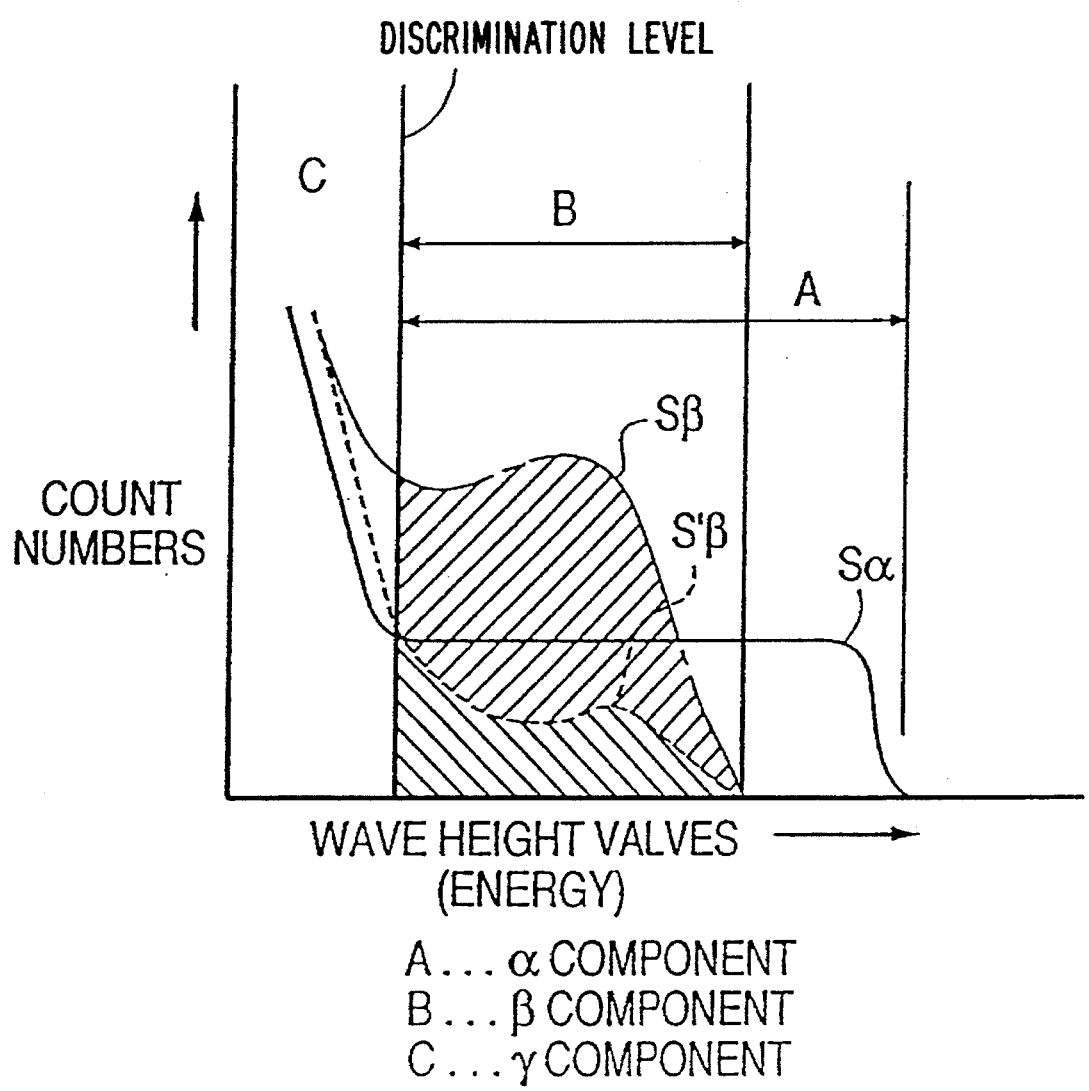

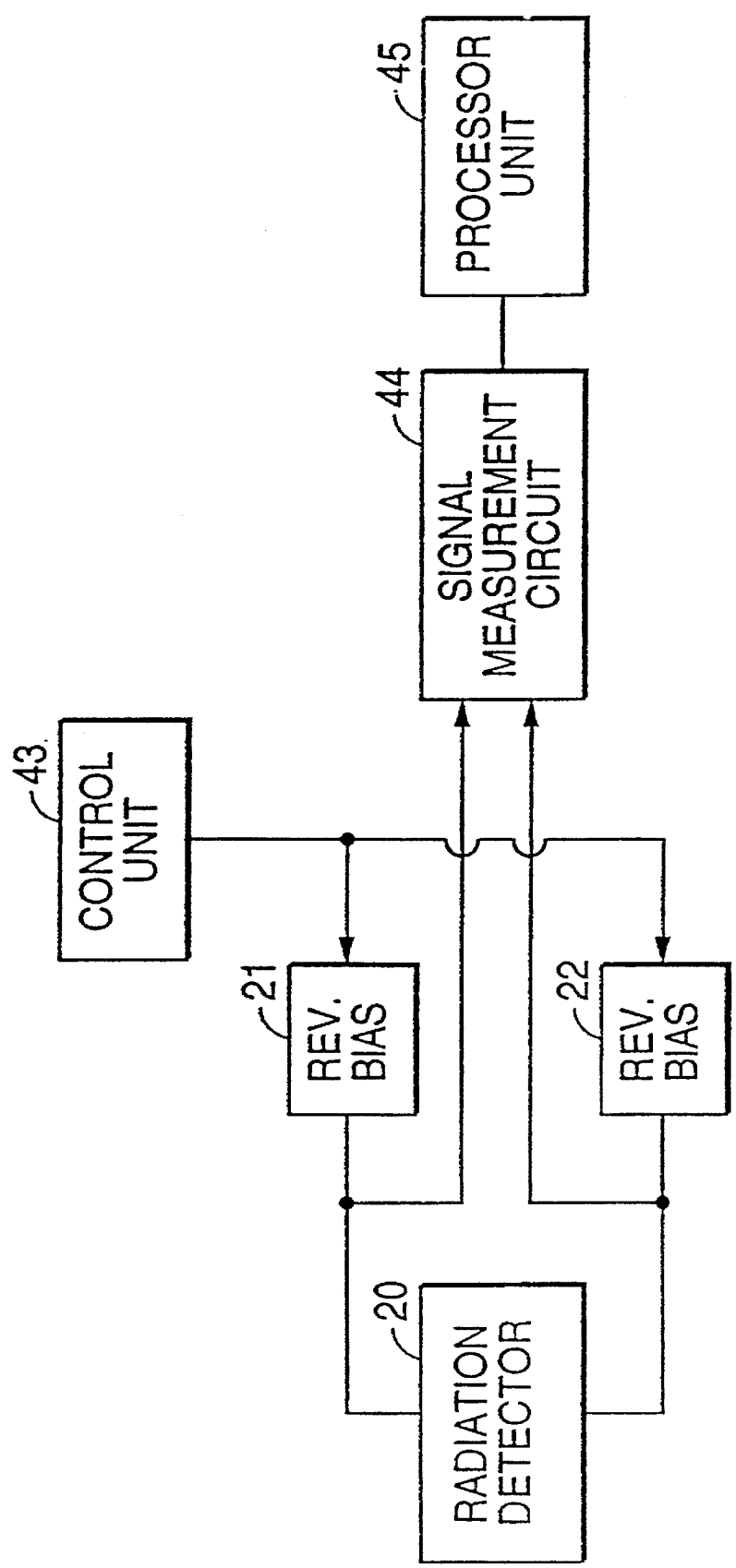

SEMICONDUCTOR RADIATION DETECTION APPARATUS FOR DISCRIMINATING RADIATION HAVING DIFFERING ENERGY LEVELS

This is a Continuation of application Ser. No. 08/130,425, filed Oct. 1, 1993, which is a Continuation of application Ser. No. 07/789,129 filed Nov. 26, 1991, both now abandoned.

BACKGROUND OF THE INVENTION

The present invention relates to a semiconductor radiation detection apparatus such as radiation monitors, individual exposure dose meters or survey meters to be used in radiation handling facilities such as nuclear power stations or reprocessing facilities.

A prior art semiconductor radiation detector is described in Japanese Patent Publication No. 56-129380 (1984). According to this prior art, a multi-layer semiconductor radiation detection element or device is provided by growing (through epitaxial crystal growth) or bonding a low specific resistance (or lowohmic) layer on a high specific resistance (or high-ohmic) semiconductor layer, and further growing or bonding another high specific resistance layer thereupon. Output electrodes are formed in contact with each of high specific resistance layers and a common electrode in the low specific resistance layer in the semiconductor radiation detection element, with a lead wire attached to each electrode, constituting a semiconductor radiation detector. By applying respective reverse bias voltages between the common electrode and each of the two output electrodes in the semiconductor radiation detector, depletion regions are formed in both of the high specific resistance semiconductor substrates. When incident radiation enters these depletion regions, a pulse signal is generated on an associated output electrode, thus effecting detection of incident radiation. When both α and β rays enter and traverse the semiconductor detector, the respective components of α and β rays can be distinguished and measured quantitatively separately from each other due to the difference in the penetration power. That is, while the β rays can penetrate through both depletion regions, α rays do not penetrate to the second depletion region, and are therefore detected only in the first region.

In the following description, the semiconductor radiation detection apparatus refers to a semiconductor radiation detector provided with reverse bias voltage applying means, and signal processing means for processing signals from the output electrodes.

The utility of the above-mentioned prior art involving lamination or bonding processes or the like in forming multilayered semiconductor radiation detection elements is limited because it cannot be further improved in sensitivity for several reasons.

Firstly, the bonded portion or the low specific resistance layer becomes a radiation insensitivity band or dead band in which energy of β rays having a large penetration factor is lost, thereby lowering detection sensitivity for β rays.

Second, in the case of, for example, a silicon semiconductor, the specific resistance factor of a high specific resistance body formed by lamination is limited, at most, to several tens of Ohm centimeters (Ω.cm). Assuming an applied reverse bias of 100 V, the thickness of a depletion region to be formed is 16 μm at most according to equation (1) to be explained later. The necessary thickness of the depletion region, on the other hand, depends on the energy of the radiation, and when the energy of α rays is assumed to be 8 MeV, the necessary thickness becomes 60 μm; thus, a maximum thickness of 16 μm cannot suffice as a necessary detection sensitivity. Although it is possible to obtain a necessary depletion region by increasing the applied voltage, this requires as much as 4000 V, hence diminishing the primary advantages of low voltage operation unique to semiconductor detectors.

Third, as described previously, according to the lamination method, it is difficult to form a high specific resistance body having a specific resistance exceeding several tens of Ω.cm. Because low specific resistance bodies contain many impurities and defects, substantial currents are generated in the semiconductor materials, and a leakage current per unit area in the detection element cannot be reduced. Generally higher sensitivity can be realized with larger area. According to the prior art, however, when the area is increased, the degree of the leakage current becomes far greater, thus failing to achieve the desired high sensitivity. According to the prior art, the maximum diameter practically obtainable is 5cm.

Fourth, as the prior art constructions are not capable of adapting to arbitrary energy levels, for instance, of α rays, a desired high sensitivity cannot be realized. This is because the necessary thickness of the depletion region depends upon the energy levels of radiation rays as hereinabove described, and needs to be made greater with an increased level of energy. When the thickness is greater than necessary, however, a portion of the depletion region other than required is likely to detect radiation rays other than the objects to be measured, thus becoming a noise source, and failing to provide a high sensitivity. Thus, it is necessary to be able to control the thickness of the depletion region according to the energy level of an object to be measured. According to the prior art devices, however, the thickness of the depletion layer is fixed, and is unable to satisfy the above requirements. This applies likewise where a pair or depletion regions are formed in order to discriminate at least two kinds of radiation rays, for example, such as α rays and β rays as above.

A second problem associated with a laminated structure made by bonding of a semiconductor radiation detection element is that it has a low heat resistance capability and reliability due to the differences in heat expansion coefficients between the respective layers.

A third problem is that according to the lamination method, a large number of fabrication steps are required; a process of laminating a low specific resistance film on a high specific resistance film; and another lamination of a high specific resistance film thereupon, and the like.

SUMMARY OF THE INVENTION

A first object of the present invention, is to provide a semiconductor radiation detector and a semiconductor radiation detection apparatus having an improved high sensitivity in measurements.

A second object of the present invention is to provide a semiconductor radiation detector and a semiconductor radiation detection apparatus having a high reliability.

A third object of the present invention is to provide a semiconductor radiation detection element which is easy to fabricate, and a method of fabricating the same.

The foregoing objects of the present invention may be accomplished by forming pn junctions in the top and bottom surfaces of a single semiconductor, in particular of a high specific resistance semiconductor having a specific resistance factor exceeding 50 Ω.cm.

The first object of the present invention may be accomplished by forming a common electrode in a substrate region for the two pn junctions, or by forming a guard ring in the periphery of the pn junctions in the top and bottom surfaces of the semiconductor. In addition, the first object of the present invention may also be accomplished by applying a variable reverse bias voltage to the electrodes formed in contact with a pair of pn junctions in the top and bottom surfaces of the semiconductor.

The following advantages are accomplished by forming pn junctions in the top and bottom surfaces of a single wafer of semiconductor substrate according to the present invention, especially of a high specific resistance semiconductor substrate with a specific resistance factor exceeding 50 Ω.cm.

First, a semiconductor radiation detector and a semiconductor radiation detection apparatus are provided in which a high sensitivity is achieved. Secondly, through elimination of the bonding process necessary in the prior art, a highly reliable semiconductor radiation detector and semiconductor radiation apparatus are provided. Thirdly, a semiconductor radiation detection element easy to fabricate and a method of its manufacture are provided.

Further, by providing a common electrode in the substrate for two of the pn junctions, a semiconductor radiation detector and semiconductor radiation detection apparatus in which a high sensitivity is realized are provided.

Still further, by providing a guard ring in the periphery of pn junctions in the top and bottom surfaces of the semiconductor substrate, a semiconductor radiation detector and semiconductor radiation detection apparatus in which leakage currents are minimized and high sensitivity in the measurement is realized are provided.

Furthermore, by application of variable reverse bias voltages to respective electrodes formed in contact to the diffused layers of pn junctions formed in the top and bottom surfaces of the semiconductor, other advantages as follows are achieved.

The first semiconductor radiation detector and semiconductor radiation detection apparatus in which high sensitivity is realized are provided. Second, energy spectra of radiation rays to be measured can be provided.

Finally, in combination of the hereinabove means, a semiconductor radiation detector and semiconductor radiation detection apparatus in which sensitivity of measurement is improved as high as 20 to 40 times greater are provided.

Other objects, advantages and novel features of the present invention will become apparent from the following detailed description of the invention when considered in conjunction with the accompanying drawings.

BRIEF DESCRIPTION OF THE DRAWINGS

FIG. 4 shows measured spectra of α and β rays;

FIG. 7 shows a schematic diagram of an α.β ray discrimination measurement apparatus;

DESCRIPTION OF THE PREFERRED EMBODIMENTS

Figure 1:
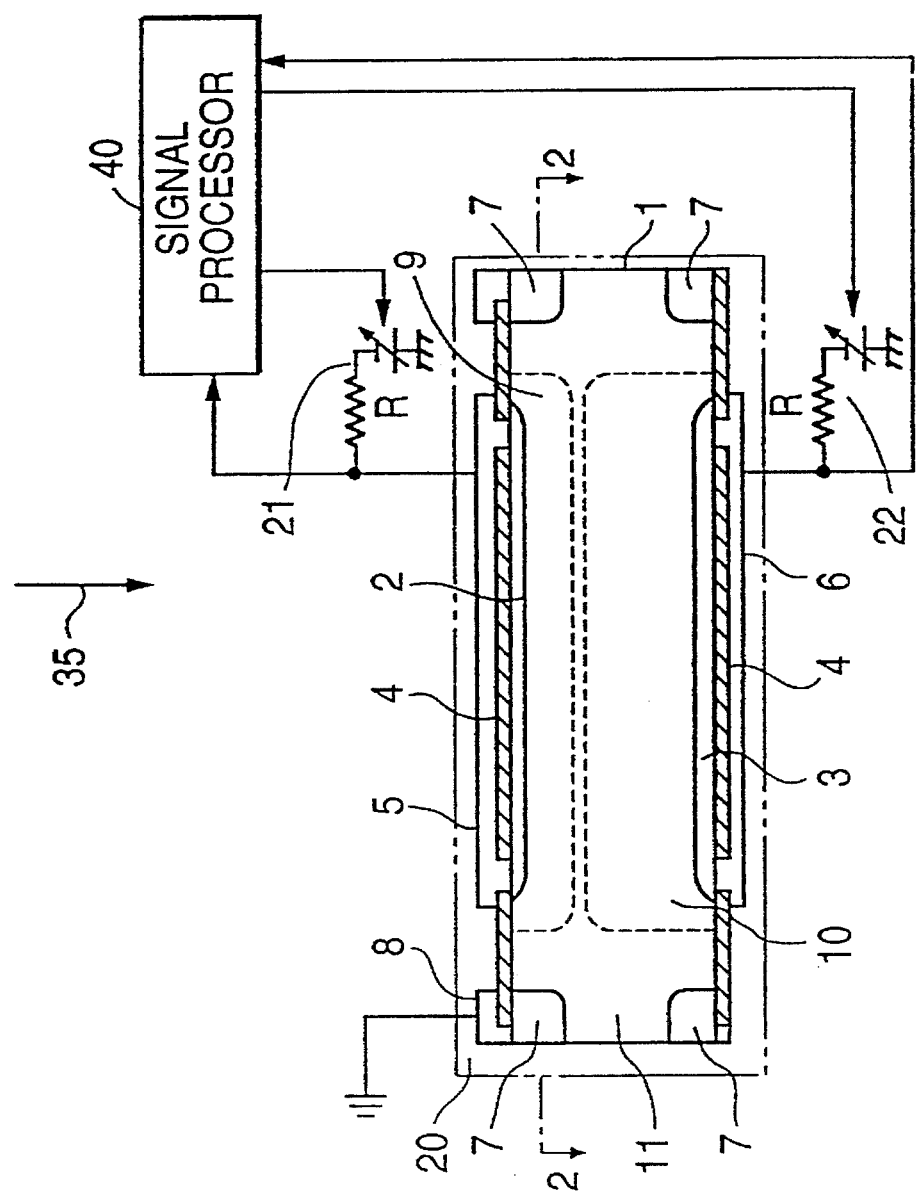
FIG. 1 is an embodiment of the present invention.

FIG. 1 shows a semiconductor radiation detector of an embodiment of the present invention. Diffused layers 2 and 3 are formed in the top and bottom surfaces of a single semiconductor wafer 1 forming respective pn junctions with the semiconductor wafer, and signal output electrodes 5 and 6 for retrieving signals outside are formed in both surfaces of the semiconductor substrate. These elements in combination constitute a semiconductor radiation detection element, which is secured in a protective case (not shown here), with lead wires connected to output electrodes, to provide a semiconductor radiation detector. Reverse bias voltages V are applied to the output electrodes of the semiconductor radiation detector to form depletion regions 9, 10, which define a substrate region 11 (being that portion of the semiconductor wafer 1 which lies outside the depletion regions 9, 10) as shown in FIG. 1.

When radiation such as α rays and β rays enter such a semiconductor radiation detector generally in the direction indicated by arrow 35, the energy of α rays having a smaller penetration power is absorbed in the depletion region 9 near the incident surface, and that of β rays having a larger penetration power is absorbed mainly in the depletion region 10. Each such absorption is converted to an electrical pulse signal which is output from the output electrodes. In FIG. 1, the output signals are put out through a filter. As described above, according to the positions of the depletion regions, pulse signal counts and the like, discrimination between radiation rays and measurements of their intensities is achieved.

As can be appreciated from the above description, it is the depletion regions that detect radiation. Because the present invention successfully eliminates the prior art bonded layer between two depletion regions or a low specific resistance region to be formed to reduce the resistance between the two substrate regions, the two depletion regions can be formed in close proximity to each other, thereby permitting the energy of β rays to reach the depletion region 10 without being absorbed in the insensitivity band. Hence, the detection sensitivity for β rays is improved substantially.

Further, because a single semiconductor wafer constitutes a detection element, such problems as peel-off associated with the prior art have been eliminated. Thus, the detection arrangement according to the invention provides a highly reliable semiconductor radiation detector and semiconductor radiation detection apparatus.

Still further, because the present invention can be provided in the form of diffused layers in the top and bottom surfaces of a single semiconductor wafer, it can be fabricated easier than by the lamination method of the prior art.

According to the present invention, other advantages in comparison with the prior art lamination method are also achieved by providing a single semiconductor wafer of a high specific resistance semiconductor substrate. For instance, the required thickness of the depletion region depends upon the energy of radiation of an object to be detected. On the other hand, the depth w(μm) of a depletion region to be formed when a reverse bias voltage V(v) is applied, in the case of a P-type silicon with a specific resistance factor of ρ(Ω.cm), is approximated by equation (1) as follows:

$$w = 0.3 \sqrt{\rho \cdot V} \quad (1)$$

In order to detect α rays having energy of 8 MeV, it is necessary for the depletion region to have a depth of 60 μm, which requires a specific resistance factor ρ for the semiconductor material (assuming an applied practical reverse bias voltage to be 100 V), of 400 Ω.cm, a value which is fully attainable. In the present invention, the high specific resistance semiconductor refers to one having a specific resistance of values exceeding several tens Ω.cm attainable by the lamination method, more specifically over 50 Ω.cm. Hence, it is fully capable of coping with high energy α rays.

Further, as described above, because the leakage current per unit area of the high specific resistance semiconductor can be reduced, total effective area can be increased. While a large area ratio was not possible using the lamination method, because a single wafer semiconductor substrate constitutes a semiconductor radiation detection element according to the present invention, a very large area can be obtained. Because the extent of the depletion region depends upon an area A, an expansion in terms of physical area is directly related to an increased detection area, hence realizing a high sensitivity. According to the present invention, a very large area of, at least, 80 cm², which is four times greater than the prior art detectors, is available.

Another function available through providing a common electrode in the substrate region, for the two pn junctions will be described below. As the depletion region is an insulation layer, the substrate region may be regarded as a conductor portion relative to the depletion region, even when a high specific resistance substance having a resistance factor of several to several tens Ω.cm is employed as a semiconductor wafer. Hence, it is possible to provide the common electrode in the substrate region, without forming an additional low specific resistance layer therebetween which is immune or insensitive to radiation. In FIG. 1, there is provided a common electrode 8 in the periphery of the semiconductor wafer. This technique may also be applied to prior art detectors to obtain the same effect without forming a low specific resistance layer, but forming respective electrodes to each of, for example, two substrate, and externally connecting the two electrodes. As a result, the low specific resistance layer which is insensitive to radiation can be eliminated, hence realizing proportionally higher sensitivity.

Another advantage of providing a guard ring formed in the periphery of pn junctions in the top and bottom surfaces of the semiconductor wafer will be described in the following. When there exist defects in the semiconductor wafer, a leakage current flows therethrough. Generally speaking, there are likely to exist many defects in the surfaces and side walls of a semiconductor, which were subjected to slicing or surface treatment. By providing a guard ring in the surface or side wall where many defects exist, it is possible to prevent the formation of depletion regions in such areas, hence suppressing leakage currents which would otherwise be added as output signals. As a result, an increased sensitivity is realized, and the drop of sensitivity due to the leakage currents is minimized.

Last, still another advantage of an arrangement whereby variable reverse bias voltages can be applied to the respective electrodes in contact with each of the two pn junctions formed in the top and bottom surfaces of the semiconductor will be described in the following. As set forth above, the necessary thickness of the depletion region depends upon the penetration energy of radiation. In particular, when discriminating between α rays and β rays, it is necessary to determine a thickness of the depletion region according to the energy of α rays. When the thickness of the depletion region 9 is small relative to the energy of α rays, α rays will enter the depletion region 10, thereby failing to discriminate between α rays and β rays. On the other hand, when the thickness of the depletion region 9 is larger relative to the energy of α rays, a thicker portion than necessary is likely to detect radiation other than for the objects of analysis, thereby becoming a noise source and lowering an S/N ration, consequently failing to achieve the desired high sensitivity. Therefore, by controlling the thickness of the depletion region 9 depending on the energy of α rays, the present invention assures precision of measurement, and hence improving S/N ratios and implementing high sensitivity.

According to the prior art, in which applied voltages are constant, it was not possible to change applied voltages according to the energy of α rays at each sit of measurement. It is possible to apply the foregoing variable voltage technique according to the invention to prior art detectors, to obtain the same effect as the present invention by providing an arrangement whereby a variable voltage is capable of being applied to the electrode. Further, it is possible to eliminate the insensitive or deadband between the depletion regions by changing the thickness of the depletion region assigned for detecting β rays with respect to a thickness of the depletion region assigned for detecting α rays. This eventually provides a high sensitivity also for β rays. A thickness of the depletion region for β rays cannot be too large because β rays have a larger penetration power in comparison with α rays.

Figure 2:
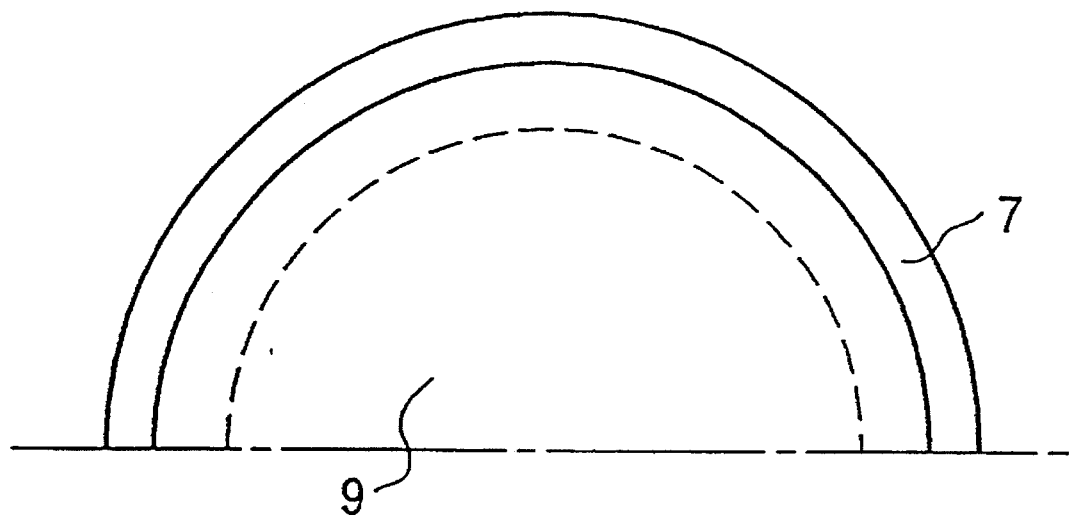
FIG. 2 is a cross-section view taken away along lines A—A of FIG. 1.

A further detailed description of the present invention will be given with reference to preferred embodiments. As noted previously, FIG. 1 shows a semiconductor radiation detection apparatus (hereinafter referred to as a detection apparatus) or a preferred embodiment of the present invention. The detection apparatus comprises a semiconductor radiation detector 20 (hereinafter referred to as a detector) enclosed by broken lines, power sources 21 and 22 for applying reverse bias voltages to the electrodes of the detector, load resistances R for retrieving an output signal from the detector 20, and a signal processor 40 for processing such output signals. FIG. 2 shows a cross-section view of the detector 20 cut away along lines A—A in FIG. 1.

Referring still to FIG. 1, the detector 20 comprises a semiconductor radiation detection element or device (hereinafter referred to as a detection element) which is formed in a single semiconductor wafer 1 with an electrode and a protective coating provided thereto, and a case (not shown) to secure and protect lead wires from the electrodes and the detection element thereto. In this preferred embodiment, a high specific resistance body of a P-type silicon semiconductor is utilized as the semiconductor wafer 1. An n⁺ diffused layer containing phosphorus impurities is formed in the top and bottom surfaces of a single semiconductor wafer 1 through thermal diffusion method, or aluminum metals and the like are vacuum deposited thereupon. Consequently, respective pn junctions are formed between each of the two diffused layers 2, 3 and other portions of the semiconductor wafer 1. The thermal diffusion method provides a diffused junction, while the vacuum deposition method provides a surface-barrier type junction. FIG. 1 is an example of the diffused junctions thus formed.

The top and bottom surfaces of semiconductor wafer 1 are insulated with silicon oxide films 4, and output electrodes 5, 6 for retrieving signals are provided to parts of the pn junctions through vapor deposition of aluminum metals, or the like. Channel stoppers 7 of $P^+$ layers are provided in the outer periphery of the top and bottom surfaces of the semiconductor wafer 1, and serve as guard rings to reduce leakage currents, particularly surface leakage currents (hereinafter, in this embodiment, the term guard ring is used instead of the channel stoppers). By applying positive reverse bias voltages to the output electrodes 5, 6, and grounding a guard ring electrode 8 (common electrode) provided at the guard rings, depletion regions 9 and 10 are permitted to expand from the respective $n^+$ diffused layers 2 and 3 in the top and bottom surfaces. Guard rings 8 serve to prevent the depletion regions from expanding in the lateral direction of the semiconductor wafer 1, hence preventing isolation breakdown which can occur when the expansion reaches the side edges.

When it is desired to discriminate a plurality of types of radiation, a surface in the vicinity of the depletion region assigned for detecting radiation with a small penetration power will serve as an incidence window. Naturally, the incidence window ought to have a thickness so small, preferably less than 0.5 μm, that loss of radiation due to incident determent is negligible. In the case of discrimination measurements of α and β rays, α rays depending upon their energies have a penetration power (flight distance) ranging from several μm to several tens of μm. On the other hand, B rays have a continuous energy spectrumranging from OeV to the maximum energy EeV, and their flight distance is greater by the order of one digit than that of α rays at the maximum energy EeV under the same conditions.

Hence, in FIG. 1, when an incident window is set in the side of diffused layer 2, depletion region 9 serves as a detection region for both α and β rays, while depletion region 10 serves as a detection region only for β rays because α rays fail to reach it. In a case when nuclear species of α rays to be measured are known in advance (thus implying that their energies are known; in the measurement of charged particles it is common to chemically separate nuclear species to be measured in the pretreatment of specimens), a depth of depletion region 9 can be set readily to conform to the penetration power of α rays through controlling the reverse bias voltage as described previously.

A region between depletion region 9 and depletion region 10 constitutes an insensitive band layer in the detection of radiation. β rays incoming into this portion do not contribute to the detected β ray signals. Therefore, it is very important to minimize this insensitive layer in the detection of β rays. As for the detection element according to the present invention, after defining a necessary depth for depletion region 9 required for the detection of α rays, it is possible to assign a remaining portion solely to the depletion region 10 for the detection of β rays. That is, the depth of depletion region 10 for β ray detection can be set readily by the reverse bias voltage to be applied to the output electrode 6 in the β ray detection side.

This is only possible through the utilization of the detection element structure of the present invention. According to the prior art where a common electrode which becomes insensitive in the detection of charged particles is provided physically between the two high specific resistance layers, it cannot provide such an ideal condition available through the embodiment of the present invention. However, even in the prior art, although the thickness of the depletion region for β rays cannot be adjusted to correspond to a varying depth of the depletion region for α rays as to eliminate the insensitivity band, the depth of the depletion region for α rays can be controlled to match the maximum energy of α rays so as to improve the sensitivity to α rays, through providing variable reverse bias voltage application means for α rays.

The extent of the depletion region depends on the area A of the pn junction, and its depth is expressed by equation (1) as explained previously. Electrical capacitance $C_{PF}$ is approximated by the following equation.

$$C_{PF} \approx 10^4 \cdot \frac{A}{W} \tag{2}$$

where, A is determined by the shape of a pn junction, and W changes with varying reverse bias voltage Hence, the extent and depth of the depletion region can be confirmed through measurement of the electrical capacitance C which includes the reverse bias voltage as one of its parameters.

Figure 3:
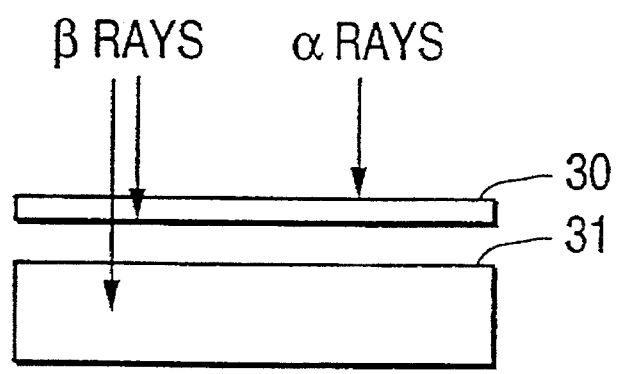
FIG. 3 shows the principle of α.β ray discrimination measurements.

FIG. 3 shows the principle employed to discriminate between α and β rays. Numeral 30 denotes a depletion region (SSDα for detecting α rays placed at an incident side of radiation, and numeral 31 denotes another depletion region (SSDβ) formed in the subsequent stage for detecting β rays. Signal detected at respective regions will be denoted as Sα and Sβ. Sα and Sβ produce respective pulse counter wave forms corresponding to the incidence of radiation into the associated depletion region.

FIG. 4 plots the respective pulse count values of Sα and Sβ as a function of their wave height values, or shows their measurement spectra. The wave height values are proportional to their energy levels. As the abscissa in FIG. 4 indicates the energy level, FIG. 4 can be appreciated as simply indicating energy spectra of Sα and Sβ irrespective of the thickness of depletion regions SSDα 30 and SSDβ 31. In FIG. 4, Sα and Sβ indicate the values obtained in the present invention, and Sβ' indicates the values in the prior art. SSDα 30 (FIG. 3) detects a portion of β rays under a certain level which take a continuous range of energy from OeV upward, and all of α rays. On the other hand, SSDβ 31 detects β rays above the certain level of energy.

A contribution factor fβ of the signal Sα detected in SSDα 30 to β rays can be determined through calibration by utilizing a β ray source the maximum energy of which is known beforehand. Further it is also possible to calculate fβ based on the maximum energy of β rays $E_{max}$ determined from the measured spectrum in the β ray detector portion of the present invention. From these relationships, a net α ray measured value Cα and a net β ray count value Cβ are expressed by the following equations.

$$C\alpha = S\alpha - f\beta(S\beta) \tag{3}$$

$$C\beta = S\beta \tag{4}$$

These calculated values sα, Sβ contain γ ray components. As shown in FIG. 4, however, as the wave height values of γ rays are so small in comparison with those of α and β rays, these components are readily discriminated in a discrimination circuit.

As explained with regard to the prior art, when a common electrode is formed between two high specific resistance members eventually decreasing the detection sensitivity for β rays, a spectrum Sβ' as shown in FIG. 4 is given. As is obvious from the equations (3) and (4), this will affect directly the net count values Cα and Cβ representing α and β rays. With respect to Cα, the discrimination capability for α and β rays falls extremely in performance. With respect to Cβ, its detection sensitivity falls directly. Thereby, a difference in sensitivity for the present invention in comparison with the prior art is five to ten times greater.

In this embodiment of the present invention, a common electrode is formed in the substrate region for a pair of pn junctions. As the substrate region is regarded as a conductor part in comparison with the depletion region as explained above, the substrate region is capable of serving as the common electrode. Thus, there is no need to provide a low specific resistance layer therebetween. Elimination in this manner of the unnecessary insensitivity band between the two depletion regions, yields a greatly improved high sensitivity. Even in prior art detectors, it is possible to obtain the same effect by removing the unnecessary low specific resistance layer through provision of a common electrode in the substrate regions so as to make the two substrate layers at the same potential through said electrode.

In the preferred embodiment of the present invention, a channel stopper (guard ring) is provided to suppress leakage currents in the substrate region in the periphery of the top and bottom surfaces of the semiconductor wafer. In this embodiment, as shown in FIG. 1, the common electrode 8 is connected to the guard ring 7 which is composed of p$^+$ region in contrast to the diffused layers 2 and 3 composed of n$^+$ regions. Without the guard ring, the depletion region tends to extend laterally rather than in the direction of depth, sometimes reaching the edges of the substrate, causing insulation breakdown. Because of the provision of the guard ring, the depletion region is suppressed from extending toward the surface and edge portions where numerous defects exist which may become the sources of leakage currents. Hence, the leakage currents can be minimized. From this view point also, this preferred embodiment of the present invention can contribute to the realization of a very high sensitivity. In this embodiment, the common electrode 8 is formed in contact with the guard ring 7, but the same effect will be achieved by providing the common electrode 8 in other portions of the substrate layer.

Due to the structure of the detection element in this embodiment of the present invention, a multi-layered detection element can be fabricated in a single wafer of high specific resistance body. Hence there is entirely no need for the other detection elements to be laminated or bonded thereupon. For example, in forming diffused junctions therein, it is possible to perform thermal diffusion processing both in the top and bottom surfaces thereof concurrently, thus reducing the process of manufacture and the fabrication cost of the detection elements by as much as one third, in comparison with those of the prior art. In addition, because of the elimination of lamination or bonding in its fabrication, the lowered heat resistance in components due to the differences in thermal expansion coefficients can be prevented, and mechanical vibration resistance is improved, thereby increasing reliability substantially.

Further, according to the prior art lamination method of epitaxial growth, the resistance factor of a high specific resistance body is limited to several tens of Ω.cm. There exists a relationship between the leakage current Id and the resistance factor ρ as follows.

$$Id \propto 1/\rho \qquad (5)$$

Hence, it can be appreciated that the leakage current in the element or device fabricated directly in a high specific resistance body (several K Ω.cm) is extremely small. This implies that according to the prior art, the large area necessary for improving sensitivity is difficult to obtain.

As the detection element according to the present invention is capable of implementing a multi-layered detection element structure directly by utilizing a high specific resistance body having a resistance factor more than 50 Ω.cm, in particular more than several K Ω.cm, an area more than four times as large as the prior art is readily obtainable.

Figure 5A:
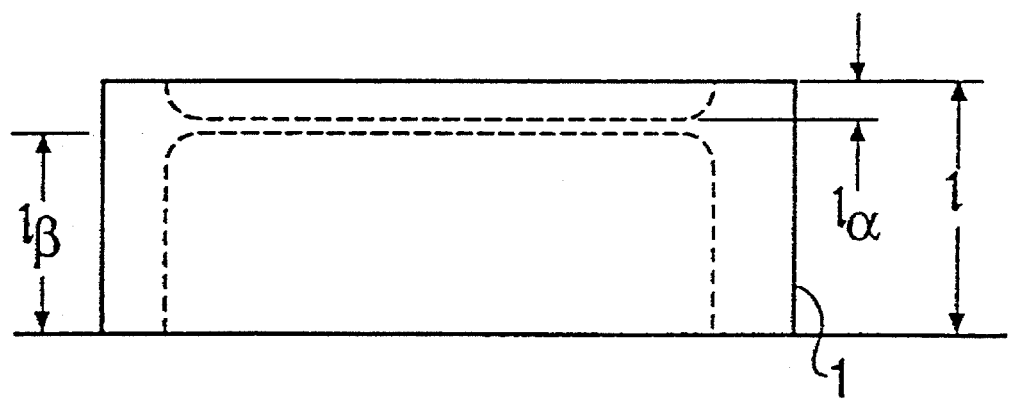
FIGS. 5A and 5B show optimum conditions for the depth of depletion regions within the high specific resistance body.
Figure 5B:
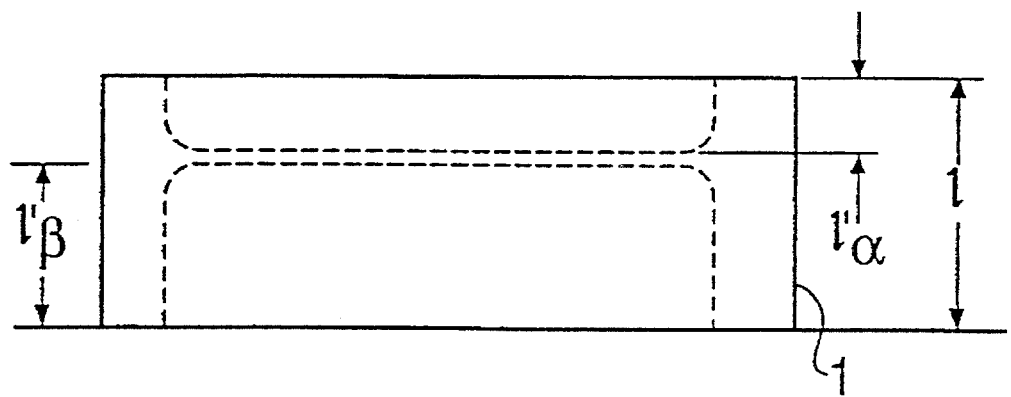

Next, an optimum method for setting SSDα and SSDβ detection elements will be described. FIG. 5A and 5B show an optimum state for depletion regions in a semiconductor substrate 1 of a high specific resistance body having a thickness of 1. (Pn junctions are not shown.) In accordance with the energy levels of α rays, the depth of the depletion region SSDα has lα or lα', while likewise, the depth of the depletion region SSDβ has lβ or lβ', respectively. Under the optimum conditions, because the thickness 1 of the high specific resistance body is constant, the following relationship will exist.

$$l \gtrless l\alpha + l\beta \text{ or } l \doteq l\alpha' + l\beta'$$

As can be seen from FIGS. 1, 3, and 5, a small but finite insensitivity band is maintained between $l_\alpha$ and $l_\beta$.

Figure 6:
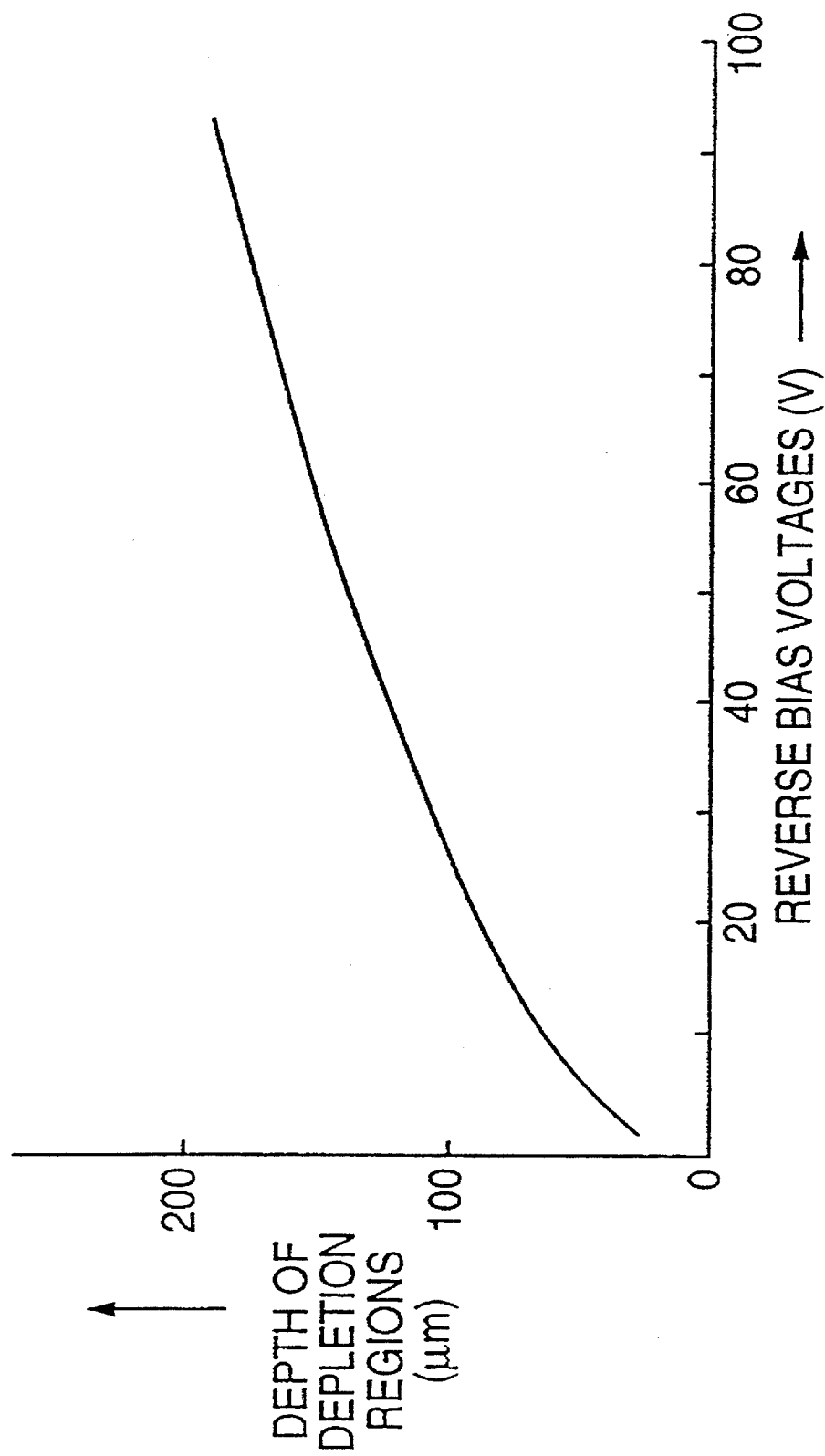
FIG. 6 shows a relationship between applied reverse bias and the depth of depletion regions.

As the resistance factor ρ of the high specific resistance body 1 is constant, the above optimum conditions will be readily provided through applying optimum reverse bias voltages to SSDα and SSDβ. A relationship between the applied reverse bias voltage and the depth of the depletion region is obtained through equation (1) substituting 4K Ω.cm for the resistance factor ρ as shown in FIG. 6. An exemplary setting of optimum conditions for a case where the thickness 1 of a high specific resistance layer is 200 μm is given in the following table.

|  | Applied Voltage | Depth of depletion region |
| --- | --- | --- |
|  | (1) |  |
| SSDα | 1 V | 19 μm |
| SSDβ | 90 V | 180 μm |
|  | (2) |  |
| SSDα | 12 V | 66 μm |
| SSDβ | 48 V | 130 μm |

Case (1) represents a structure which covers energy levels up to several MeV of α rays, and case (2) represents a structure which covers energy levels in the order of 10 MeV.

As there exists a certain relationship between the energy of α rays and the flight distance of α rays in silicon (corresponding to the necessary depth of the depletion region of SSDα), such an α.β discrimination measurement apparatus as will be described later is capable of being implemented readily. FIG. 7 shows a schematic diagram of an α.β discrimination measurement apparatus according to the present invention. This apparatus comprises a semiconductor radiation detector 20, reverse bias applying circuits 21 and 22 provided independently to the detector, a control unit 43 for controlling the reverse bias voltage, a detected signal measurement circuit 44, and an α.β ray component arithmetic processor unit 45. The control unit 43, when inputted a penetration power in terms of lα for α ray radiation nuclear species to be measured or the energy level of α rays in terms of MeV, controls the reverse bias voltages to be applied to respective detection elements so as to automatically maintain the depletion region depth 1β for β ray measurement optimum, with respect to the given thickness 1 of the detection element. In addition, ordinarily at the pn junctions there exist junction potentials (inherent potentials less than 1 V), which voltage causes the formation of a small depletion region. When a detection element having an extremely shallow depletion region is required, it is possible to utilize this inherent depletion region, without applying a bias voltage to the α ray detection portion. Accordingly, in such case it is possible to omit one of the signal output electrodes.

Although, the foregoing explanations have been focused mainly on the discrimination between α rays and β rays, the present invention can be applied readily to the measurements of α rays and low energy X rays having a smaller flight distance than that of α rays in discrimination from each other, or to the measurement of the low energy X rays and β rays in discrimination from each other.

Figure 8A:
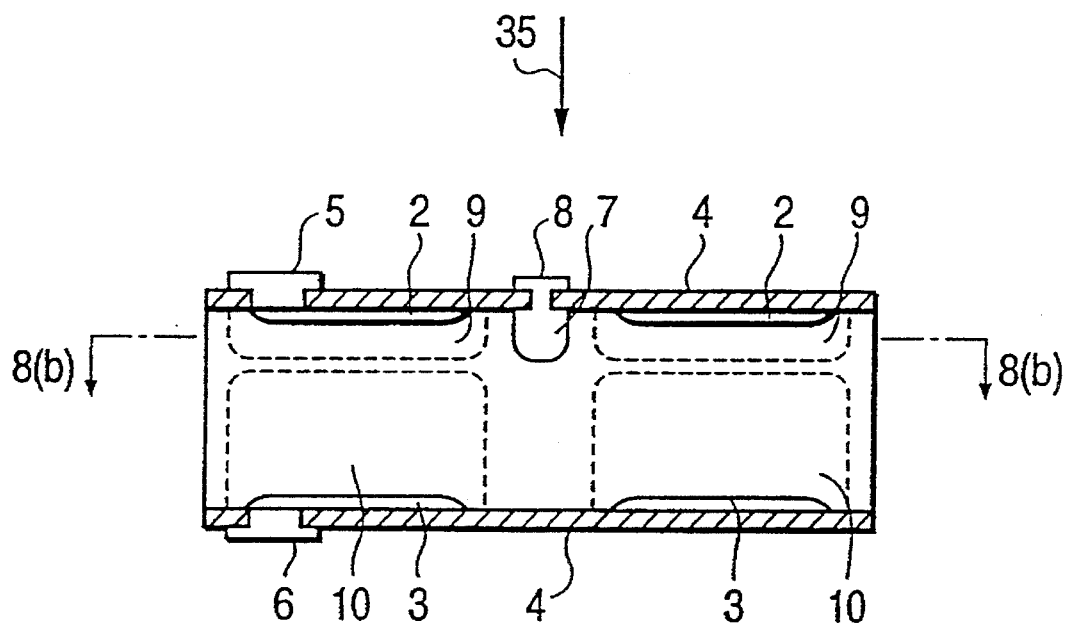
FIGS. 8A and 8B show a modified version of the embodiment of the invention.
Figure 8B:
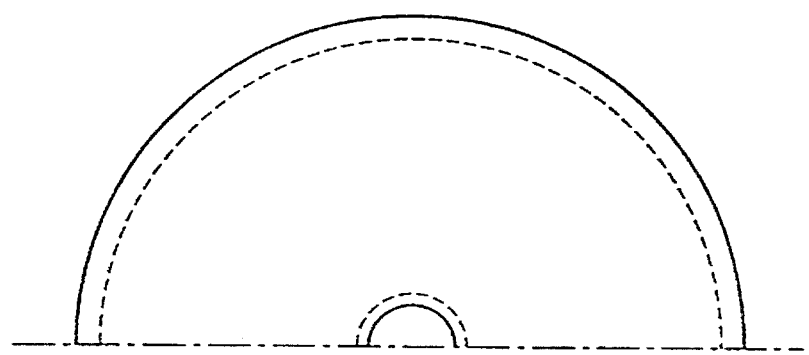

FIGS. 8A and 8B show a further embodiment of the present invention in which a pair of doughnut-shaped diffused layers 2 and 3 are formed independently in the top and bottom surfaces of a single wafer of high specific resistance body 1 so as to form a pair of depletion regions 9 and 10 with hollows therein in the obverse and reverse surfaces thereof. In the center of the wafer, an intermediate electrode (common electrode) 8 is provided, and reverse bias voltages are applied between the common electrode and respective pn junctions in the top and bottom surfaces. As can be appreciated from this modified version of the invention, an effective area sensitive to radiation can be provided in an arbitrary shape and construction according to the present invention, thus permitting the detector construction to be adjusted so as to conform to the shape of a specimen to be measured, or of an apparatus to be installed.

Figure 9B:
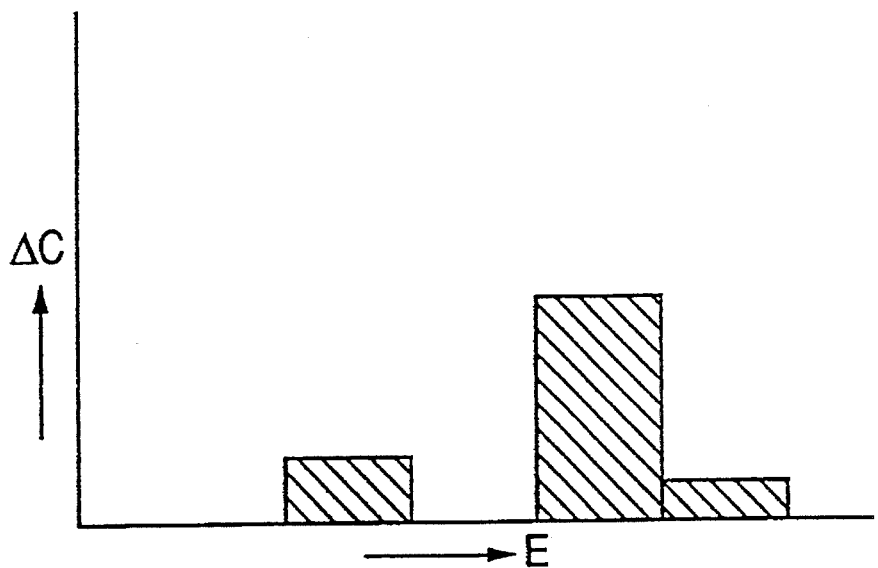
FIGS. 9A and 9B show the radiation energy spectrum measurement method according to the present invention.
Figure 9A:
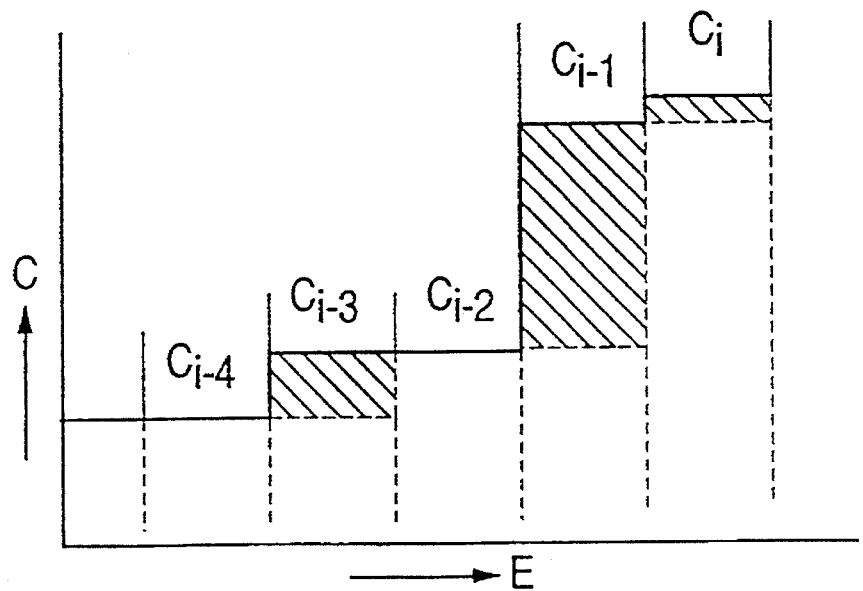

A method of measurement of energy spectrum of radiation according to the present invention will now be described. With reference to FIG. 1, a case of obtaining, for example, energy spectrum of α rays by sweeping reverse bias voltages will be explained. FIG. 9(a) shows respective total counts C relative to each reverse bias voltage, i.e., corresponding to each depth of the depletion regions. $C_i$ is at the largest depth of the depletion regions (includes radiation and charged particles having the greatest level of energy)- With decrementing from $C_{i-1}$ through $C_{i-4}$, high energy components are eliminated accordingly FIG. 9(b) shows differences between the counts C in FIG. 9(a) ($\Delta C_i = C_i - C_{i-1}$, $\Delta C_{i-1} = C_{i-1} - C_{i-2}$). The diagram (b) shows an actual result of energy spectrum obtained by the detector of this embodiment. The energy spectrum of α rays is obtained according to the above sequence. With reference to FIG. 1, the energy spectrum of β rays is similarly capable of being obtained. Further, when the largest energy of α rays is given, a thickness of the depletion region necessary to capture them can be given automatically. When the thickness of the depletion region for α rays is automatically given, it is possible automatically to determine the thickness of a depletion region for α rays.

The element or device structures described above are concerned with the pn junctions utilizing p-type silicon substrates. The present invention is likewise readily capable of being reduced to practice utilizing n-type silicon substrates, by applying negative reverse bias to signal output electrodes 5 and 6.

The explanations heretofore have been focused on the radiation (charged particles) detection elements or devices. However, it is possible to apply these detection elements of the present invention to space dose monitors (area monitors), survey meters, individual exposure does meters, and every other radiation measurement instruments and apparatuses, hence providing in each related field a practical, novel measurement apparatus capable of discriminating and measuring α and β rays simultaneously.

Figure 10:
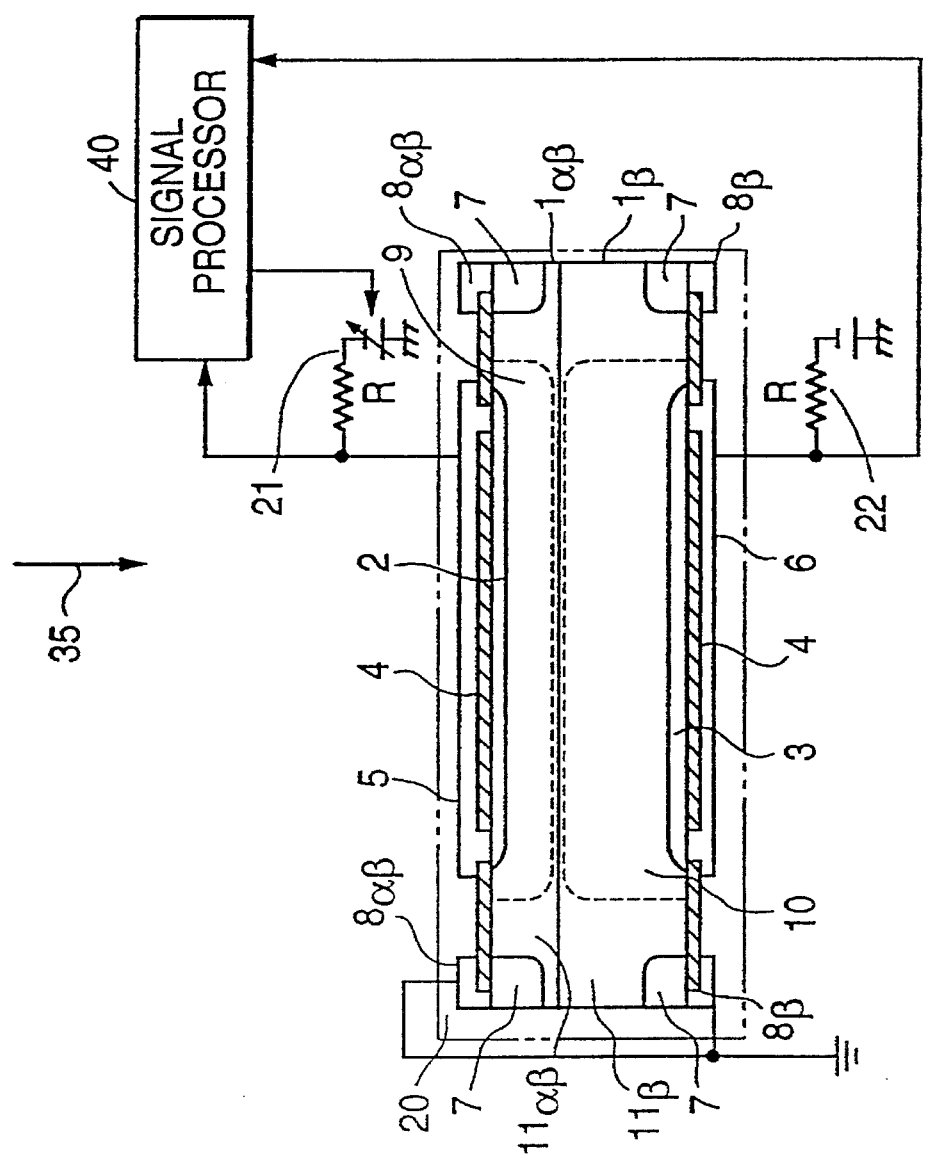
FIG. 10 shows an embodiment of the invention utilizing two semiconductor wafers sandwiched together.
Figure 11:
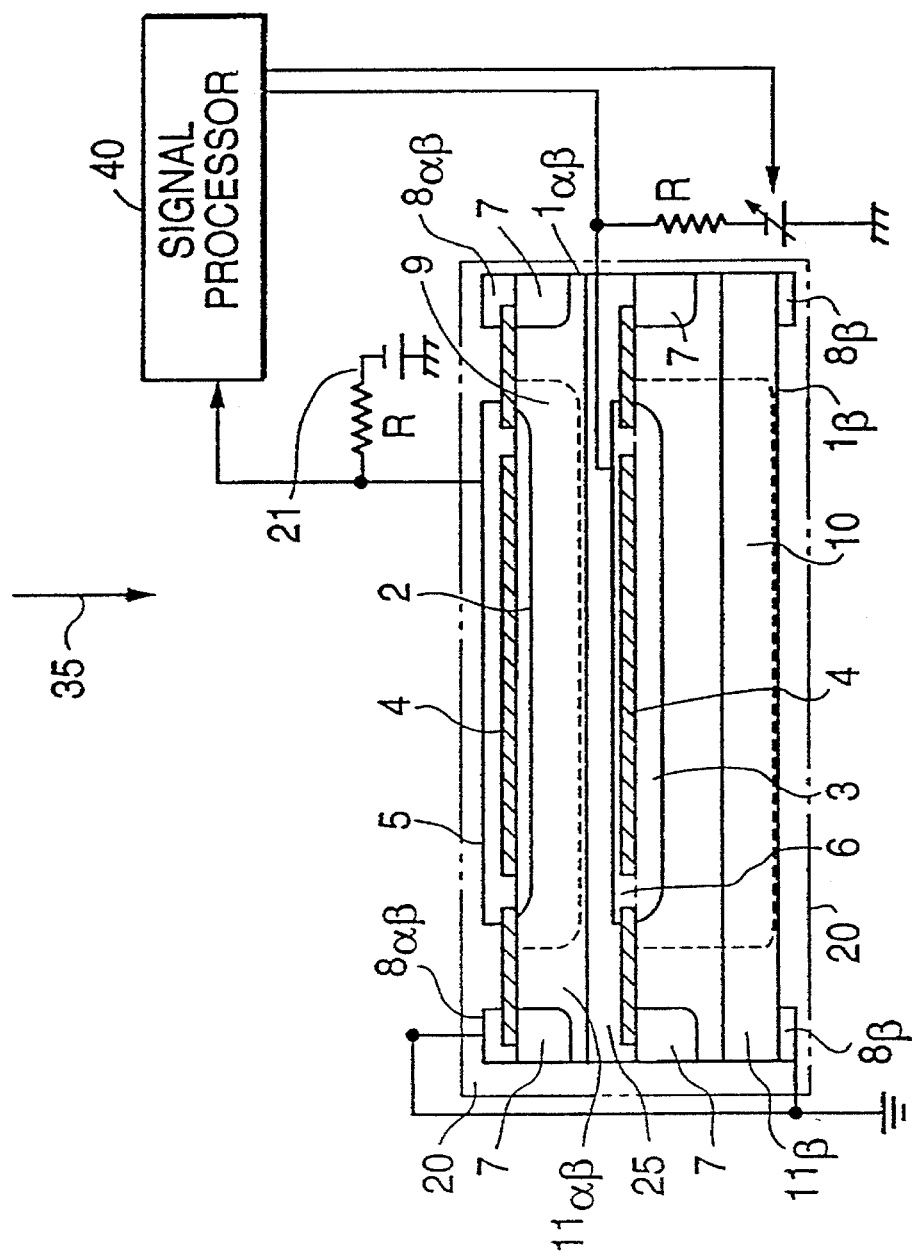
FIG. 11 shows an alternative embodiment utilizing two wafers.

Furthermore, FIGS. 10 and 11 show another preferred embodiment of the present invention to which the common electrode technique is applied to modify prior art detectors. Devices shown in both figures which have same number as one shown in FIG. 1, have the same function as shown in FIG. 1. In those preferred embodiments of the present invention, two pn junctions are formed respectively in surfaces of two semiconductor wafers $1_{\alpha\beta}$ and $1_\beta$, which are combined in a protective case (not shown) or are bonded according to the prior art. Two electrodes $8_{\alpha\beta}$ or $8_\beta$ are formed respectively in substrates $11_{\alpha\beta}$ and $11_\beta$ of the two semiconductor wafers, and are connected to each other or to ground.

The embodiment of FIG. 10 has two pn junctions formed outside the detector 20. An output voltage of a power source 21 is variable, and that of power source 22 is fixed. This embodiment can realize a high degree of sensitivity for the following reasons. First, it is capable of removing the unnecessary insensitivity band such as a low specific resistance layer between the two depletion regions. Second, it is able to detect a high energy α ray with practical voltages such as 100 V, because high resistance semiconductor wafers are available for this type of detector. Third, the depth of depletion region 9 for α rays can be controlled to match the maximum energy of the α rays as described in the embodiment shown in FIG. 1.

On the other hand, the embodiment shown in FIG. 11 has a pn junction for detecting β ray formed inside the detector 20 and an isolation film 25 between two semiconductor wafers $1_{\alpha\beta}$ and $1_\beta$. In contrast to the embodiment of FIG. 10, the output voltage of power sources 21 is fixed, and that a power source 22 is variable. The common electrode $8\beta$ is formed on the surface of the detector in order to reduce the thickness of the isolation film 25. This embodiment can also realize a high sensitivity for the following reasons. First, it can detect a high energy α ray with a practical voltage value such as 100 V like the embodiment of FIG. 10. Second, depth of depletion region 10 for β rays can be controlled to match the maximum energy of β rays as described in the embodiment in FIG. 1. In this embodiment, variable voltage of the power source 21 is available and the depth of depletion region 9 for α rays can be controlled to match the maximum energy of α rays, just as the embodiment of FIG. 10 even though there is an insensitivity hand between two depletion regions 9 and 10.

Figure 12:
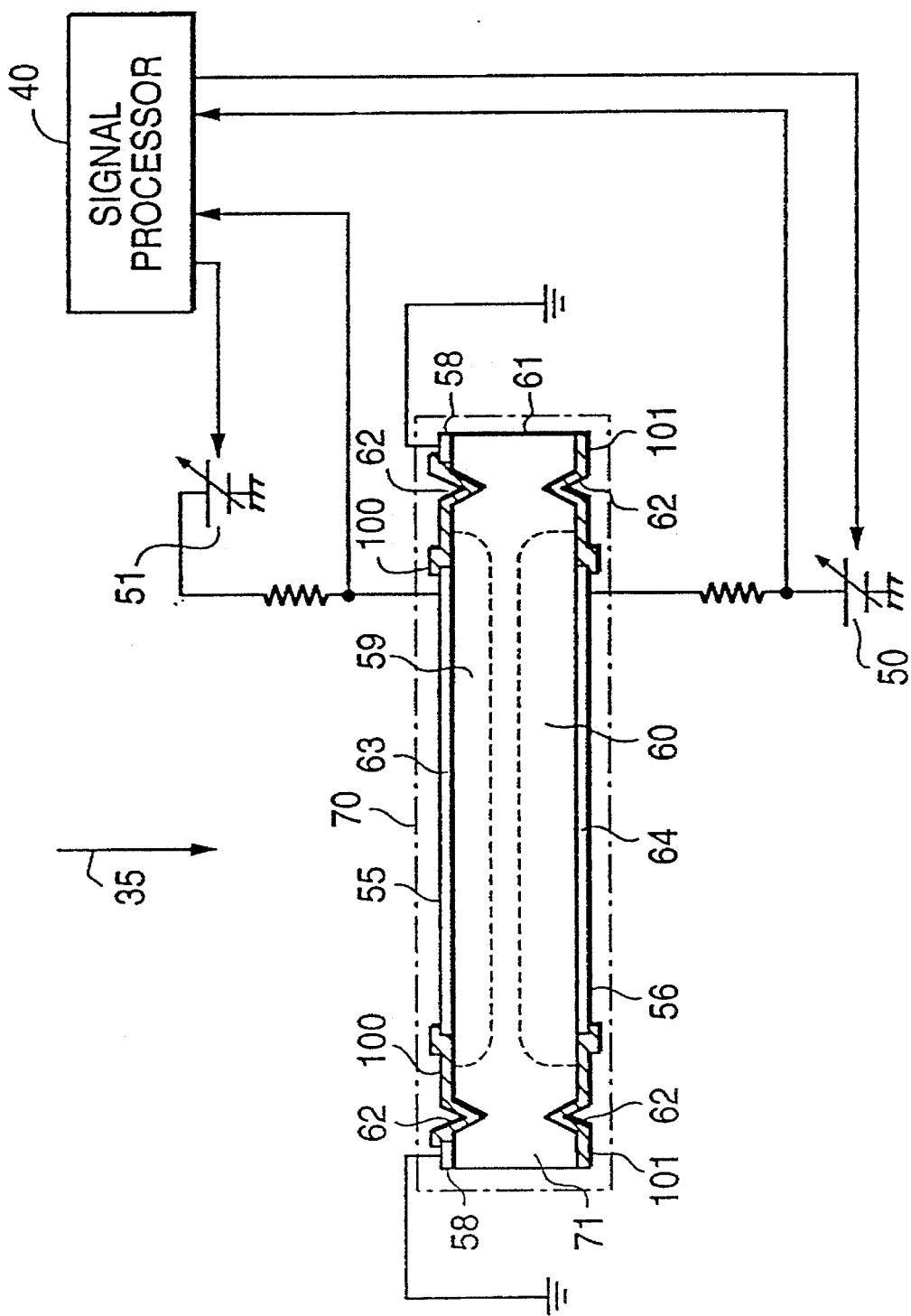
FIG. 12 shows an embodiment of the invention utilizing a chemical semiconductor such as CdTe.

Finally, although the present invention has been described by way of example of silicon to be used as the high specific resistance material, other materials including chemical semiconductors such as CdTe, $HgI_2$ or the like can be applied to the same effect. FIG. 12 shows a preferred embodiment of the present invention using a CdTe chemical semiconductor (hereinafter referred to as a CdTe semiconductor). The detection apparatus mainly comprises a detector 70 enclosed by a broken line, power sources 51 and 52 for applying reverse bias voltages to electrodes of the detector, and a signal processor 40 for processing signals obtained from the detector 70 in the manner as shown in FIG. 1. Aluminum output electrodes 55 and 56 are vacuum deposited on front and reverse surfaces of a single CdTe semiconductor wafer 61. Consequently, each pn junction 63, 64 is formed respectively by a Schottky barrier between the substrate region 71 of the CdTe semiconductor wafer 61 and output electrode 55 or 56 formed of aluminum metals. Common electrode 58 is formed by depositing Au metals so as to include a part of mesa shapes 62 which are formed on the surfaces of the CdTe semiconductor. As shown in FIG. 12, isolation pastes 100, 101 are formed on a portion of the wafer between the output electrodes 55, 56 and the common electrode 58, and on a surface of mesa shape 62 which is on the reverse of semiconductor wafer 61. In order to function the same as the example show in FIG. 1, depletion regions 59 and 60 with desired thickness are formed by applying negative reverse bias voltages to the output electrodes 55, 56. The depletion region 59 on the upper side detects both α and β rays, while the other depletion region 60 detects only β rays. The mesa shape structure is applied to the CdTe semiconductor as a guard ring in order to reduce leakage current in the substrate 61, since it is impossible to set channel stopper in the CdTe semiconductor. The principle of measurements of α and β rays in discrimination from each other is the same as one of silicon semiconductor.

The explanations heretofore have been focused on the discrimination of charged particles of α rays and β rays. The present invention, however, is capable of being applied to the measurements of proton rays and of charged particles of heavy hydrogen, tritium or the like. Namely, it can be applied to the discrimination measurements of charged particles in the facilities where high energy accelerators are utilized.

We claim:

1. Method of detecting and discriminating first and second types of nuclear radiation, said second type of nuclear radiation having an energy level which is greater than that of said first type of nuclear radiation, said method comprising the steps of:

providing a nuclear radiation detector comprising a semiconductor wafer having first and second pn junctions on opposite surfaces thereof, first and second variable voltage sources coupled to provide variable reverse bias voltages to said first and second pn junctions respectively, whereby thickness of a depletion layer generated in each of said first and second pn junctions by said reverse bias voltages may be adjusted by varying a magnitude of said reverse bias voltages, first and second signal output electrodes connected to said first and second pn junctions respectively, a common electrode coupled to provide ground potential to a substrate layer, and processor means for processing output signals generated at said first and second signal output electrodes;

adjusting thicknesses of said first and second depletion layers so that said first depletion layer outputs a signal at said first signal output electrode which is indicative of a total level of said first and second types of nuclear radiation, said second depletion layer outputs a signal at said second signal output electrode which is indicative of a level of said second type of nuclear radiation only, and said substrate layer is maintained between said first and second depletion layers;

exposing said radiation detector to nuclear radiation; and processing said output signals generated at said first and second signal output electrodes, in said processor means, to generate information concerning levels of said first and second types of nuclear radiation respectively.

2. Method according to claim 1 wherein said adjusting step comprises:

adjusting thickness of said first depletion layer so that said second type of nuclear radiation penetrates through said first depletion layer and enters said second depletion layer, while said first type of nuclear radiation is absorbed in said first depletion layer.

3. Method according to claim 1 wherein said processing step comprises subtracting a value determined as a function of said output signal generated at said second signal output electrode from said output signal generated at said first signal output electrode.

4. Method of detecting and discriminating first and second types of nuclear radiation, said second type of nuclear radiation having an energy level which is greater than that of said first type of nuclear radiation, said method comprising the steps of:

providing a nuclear radiation detector comprising a semiconductor wafer having first and second pn junctions on opposite surfaces thereof, first and second variable voltage sources coupled to provide variable reverse bias voltages to said first and second pn junctions respectively, whereby thickness of a depletion layer generated in each of said first and second pn junctions by said reverse bias voltages may be adjusted by varying a magnitude of said reverse bias voltages, first and second signal output electrodes connected to said first and second pn junctions respectively, a common electrode coupled to provide ground potential to a substrate layer, and processor means for processing output signals generated at said first and second signal output electrodes;

adjusting magnitude of said variable reverse bias voltages so that:

total thickness of said first and second depletion layers is approximately equal to thickness of said semiconductor wafer, leaving only a thin substrate layer in said wafer between said first and second depletion layers, whereby said first and second depletion layers are proximate to, but do not contact, each other; and said first depletion layer generates an output signal indicative of a total level of said first and second types of radiation, and said second depletion layer generates an output signal indicative of a level of said second type of radiation only; and processing said output signals in said processor means.

5. Process according to claim 4 wherein said adjusting step and said processing step are repeated for a plurality of variable reverse bias voltage values to determine an energy spectrum of said nuclear radiation.

6. Apparatus for detecting and discriminating different types of nuclear radiation having differing energy levels, comprising:

a plurality of radiation sensitive elements for detecting nuclear radiation impinging thereon and for generating output signals indicative of a level of such radiation, said radiation sensitive elements being arranged in physical proximity whereby they can be exposed simultaneously to radiation from a radiation source;

means for adjusting sensitivity of a first of said radiation sensitive elements to detect a total level of nuclear radiation impinging thereon;

means for adjusting sensitivity of at least a second of said radiation sensitive elements to detect only radiation having an energy level with a predetermined limit;

means for forming a layer connected to ground potential between said first and second radiation sensitive elements; and means for processing output signals from said radiation sensitive elements to determine radiation levels of said different types of nuclear radiation.

7. Apparatus according to claim 6 wherein:

said plurality of radiation sensitive elements comprises first and second pn junctions arranged on opposite surfaces of a semiconductor wafer, each of said first and second pn junctions having a signal output electrode connected thereto; and said means for adjusting comprise first and second variable voltage supplies coupled to provide a variable reverse bias voltage to each of first and second pn junctions respectively, whereby thickness of a depletion layer generated in each of said first and second pn junctions by said reverse bias voltages may be adjusted by varying a magnitude of said reverse bias voltages.

8. Apparatus according to claim 7 further comprising:

control means for automatically controlling thickness of said depletion layers in said first and second pn junctions in response to input information concerning an energy level of a particular type of radiation impinging on said radiation sensitive elements.

9. Apparatus according to claim 8 wherein said control means controls relative thickness of said depletion layers so that:

total thickness of said first and second depletion layers is approximately equal to thickness of said semiconductor wafer, leaving only a thin layer in said wafer between said first and second depletion layers, whereby said first and second depletion layers are proximate to, but do not contact, each other; and said first depletion layer generates an output signal indicative of a total level of said first and second types of radiation, and said second depletion layer generates an output signal indicative of a level of said second type of radiation only.

10. Method of measuring an energy spectrum of nuclear radiation comprising the steps of:

providing a nuclear radiation detector comprising a semiconductor wafer having first and second pn junctions on opposite surfaces thereof, first and second variable voltage sources coupled to provide variable reverse bias voltages to said first and second pn junctions respectively, whereby thickness of a depletion layer generated in each of said first and second pn junctions by said reverse bias voltages may be adjusted by varying a magnitude of said reverse bias voltages, first and second signal output electrodes connected to said first and second pn junctions respectively, a common electrode coupled to provide ground potential to a substrate layer, and processor means for processing output signals generated at said first and second signal output electrodes;

exposing said radiation detector to a source of nuclear radiation having an energy spectrum to be measured;

setting said variable reverse bias voltages at respective first levels so that total thickness of said first and second depletion layers is approximately equal to thickness of said semiconductor wafer, with only a thin substrate layer between said first and second depletion layers;

detecting values of output signals generated at said first and second signal output electrodes and storing said values in said processor means;

adjusting said variable reverse bias voltages at least to respective second levels so that total thickness of said first and second depletion layers remains approximately equal to the thickness of the semiconductor wafer, and repeating said detecting step;

comparing values of output signals detected at each of said variable reverse bias voltage levels, to generate an energy spectrum for said nuclear radiation.

11. Method according to claim 10 wherein said adjusting step is repeated until said variable reverse bias voltages have been adjusted to cover a desired range thereof.

12. A semiconductor detection apparatus for detecting nuclear radiation comprising:

a single semiconductor wafer having a first surface and a second surface;

a first pn junction formed in said first surface of said wafer;

a second pn junction formed in said second surface of said wafer;

a first voltage supply coupled to provide a first reverse bias voltage to said first pn junction for generating a first depletion layer in said first pn junction;

a second voltage supply coupled to provide a second reverse bias voltage to said second pn junction for generating a second depletion layer in said second pn junction;

a common electrode coupled to provide ground potential to a substrate layer between first and second depletion layers;

a first signal output electrode connected to said first pn junction;

a second signal output electrode connected to said second pn junction;

signal acquisition means for retrieving output signals from said electrodes; and analysis means for analyzing nuclear radiation on the basis of said output signals;

wherein at least one of said first and second voltage supplies is a variable voltage supply.

13. A semiconductor detection apparatus for detecting nuclear radiation comprising:

a single semiconductor wafer having a first surface and a second surface;

a first pn junction formed in said first surface of said wafer;

a second pn junction formed in said second surface of said wafer;

a first voltage supply coupled to provide a first reverse bias voltage to said first pn junction for generating a first depletion layer in said first pn junction;

a second voltage supply coupled to provide a second reverse bias voltage to said second pn junction for generating a second depletion layer in said second pn junction;

a common electrode coupled to provide ground potential to a substrate layer between said first and second depletion layer;

a first signal output electrode connected to said first pn junction;

a second signal output electrode connected to said second pn junction;

signal acquisition means for retrieving output signals from said electrodes; and analysis means for analyzing nuclear radiation on the basis of said output signals, said analysis means comprising means for measuring radiation within at least one preselected energy range of said radiation on the basis of said output signals.

14. A semiconductor detection apparatus for detecting nuclear radiation comprising:
    a single semiconductor wafer having a first surface and a second surface;
    a first pn junction formed in said first surface of said wafer;
    a second pn junction formed in said second surface of said wafer;
    a first voltage supply coupled to provide a first reverse bias voltage to said first pn junction for generating a first depletion layer in said first pn junction;
    a second voltage supply coupled to provide a second reverse bias voltage to said second pn junction for generating a second depletion layer in said second pn junction;
    a common electrode coupled to provide ground potential to a substrate layer between said first and second depletion layers;
    a first signal output electrode connected to said first pn junction;
    a second signal output electrode connected to said second pn junction;
    signal acquisition means for retrieving output signals from said electrodes; and
    analysis means for analyzing nuclear radiation on the basis of said output signals, said analysis means comprising means for determining an energy spectrum of said radiation on the basis of said output signals.

15. A semiconductor detection apparatus for detecting nuclear radiation comprising:
    a single semiconductor wafer having a first surface and a second surface;
    a first pn junction formed in said first surface of said wafer;
    a second pn junction formed in said second surface of said wafer;
    a first voltage supply coupled to provide a first reverse bias voltage to said first pn junction for generating a first depletion layer in said first pn junction;
    a second voltage supply coupled to provide a second reverse bias voltage to said second pn junction for generating a second depletion layer in said second pn junction;
    a common electrode coupled to provide ground potential to a substrate layer between said first and second depletion layers;
    a first signal output electrode connected to said first pn junction;
    a second signal output electrode connected to said second pn junction;
    signal acquisition means for retrieving output signals from said electrodes; and
    analysis means for analyzing nuclear radiation on the basis of said output signals, said analysis means comprising means for determining a value for a total level of first and second preselected types of nuclear radiation, means for determining a value for a level of said first preselected type of nuclear radiation, and means for determining a difference of said values.

16. A semiconductor radiation detection apparatus for detecting nuclear radiation comprising:
    at least two semiconductor wafers, each having a substrate region respectively;
    at least two pn junctions, one such pn junction being formed in each surface of said at least two wafers;
    at least two common electrodes, one such common electrode being coupled to provide ground potential to each of said substrate regions respectively;
    at least two output electrodes, one such output electrode being connected to each of said at least two pn junctions respectively;
    at least two bias means for applying reverse bias voltages to said at least two output electrodes respectively;
    signal acquisition means for retrieving output signals from said at least two output electrodes; and
    analysis means for analyzing nuclear radiation on the basis of said output signals.

17. A semiconductor radiation detection apparatus according to claim 16 wherein at least one of said reverse bias voltages is variable.

18. A semiconductor radiation detection apparatus according to claim 16, wherein said analysis means comprises means for measuring radiation within at least one preselected energy range of said radiation on the basis of said output signals.

19. A semiconductor radiation detection apparatus according to claim 16, wherein said analysis means comprises means for determining a value for a total level of first and second preselected types of radiation, means for determining a value for a level of said first preselected type of radiation, and means for determining a difference of said values.

20. A semiconductor detection apparatus for detecting nuclear radiation comprising:
    a single semiconductor wafer having a first surface and a second surface;
    a first pn junction formed in said first surface of said wafer;
    a second pn junction formed in said second surface of said wafer;
    a first voltage supply coupled to provide a first reverse bias voltage to said first pn junction for generating a first depletion layer in said first pn junction;
    a second voltage supply coupled to provide a second reverse bias voltage to said second pn junction for generating a second depletion layer in said second pn junction;
    a common electrode coupled to provide ground potential to a substrate layer between said first and second depletion layer;
    a first signal output electrode connected to said first pn junction;
    a second signal output electrode connected to said second pn junction;
    signal acquisition means for retrieving output signals from said electrodes; and
    analysis means for analyzing radiation on the basis of said output signals;
    wherein said analysis means comprises means for determining a value for a total level of $\alpha$ and $\beta$ radiation, means for determining a value for a level of $\beta$ radiation, and means for determining a difference of said values; and
    wherein said analysis means further comprises means for discriminating $\gamma$ radiation, of which wave height values are smaller than that of α and β radiation.

21. A method of detecting and distinguishing different kinds of nuclear radiation by differing energy levels, comprising the steps of:

providing a semiconductor radiation detector having first and second pn junctions formed on opposite sides of a semiconductor wafer, said pn junctions having respective first and second depletion regions associated therewith, and a common electrode coupled to provide ground potential to a substrate layer between first and second depletion regions;

applying first and second reverse bias voltages to said first and second pn junctions respectively;

adjusting a thickness of each depletion region by varying said first and second reverse bias voltages respectively, so that said thickness of each depletion region is adapted to distinguish said different kinds of nuclear radiation, and said substrate layer is maintained between said first and second depletion regions;

detecting output signals from each depletion region respectively; and analyzing said nuclear radiation on the basis of said output signals.

22. A method of detecting and distinguishing different kinds of nuclear radiation having differing energy levels, comprising the steps of:

providing a semiconductor radiation detector having first and second pn junctions formed on opposite sides of a semiconductor wafer, said pn junctions having respective first and second depletion regions associated therewith, and a common electrode coupled to provide ground potential to a substrate layer between said first and second depletion regions;

applying a reverse bias voltage to each of said pn junctions;

adjusting a thickness of said first depletion region by varying said reverse bias voltage applied to said first pn junction, so that a first type of radiation impinging on said first depletion region penetrates through said first depletion region into said second depletion region, while a second type of radiation impinging on said first depletion region is absorbed therein, and said substrate layer is maintained between said first and second depletion regions;

detecting output signals from each depletion region respectively; and analyzing nuclear radiation on the basis of said output signals.

\* \* \* \* \*